(12) United States Patent
Scherer et al.

(10) Patent No.: US 6,576,113 B1
(45) Date of Patent: Jun. 10, 2003

(54) METHOD OF ELECTROPLATING OF HIGH ASPECT RATIO METAL STRUCTURES INTO SEMICONDUCTORS

(75) Inventors: Axel Scherer, Laguna Beach, CA (US); Joyce Wong, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/699,117

(22) Filed: Oct. 27, 2000

Related U.S. Application Data

(60) Provisional application No. 60/162,489, filed on Oct. 29, 1999.

(51) Int. Cl.[7] .............................. C25D 5/34; C25D 5/02; C25D 17/00; H01L 21/3205
(52) U.S. Cl. ...................... 205/205; 205/123; 205/157; 204/224 R; 438/606; 438/712; 438/718; 438/949
(58) Field of Search ................................ 205/118, 123, 205/157, 183, 184, 186, 205; 204/224 R; 438/602, 949, 606, 712, 718, 466

(56) References Cited

U.S. PATENT DOCUMENTS

| | | | | |
|---|---|---|---|---|
| 4,033,833 A | * | 7/1977 | Bestel et al. ............ 204/224 R |
| 5,362,678 A | * | 11/1994 | Komaru et al. ...... 148/DIG. 50 |
| 5,956,216 A | * | 9/1999 | Chou ........................ 360/131 |
| 5,972,192 A | * | 10/1999 | Dubin et al. ................ 205/101 |
| 6,224,737 B1 | * | 5/2001 | Tsai et al. ................... 205/123 |
| 6,350,364 B1 | * | 2/2002 | Jang ........................... 205/118 |
| 6,372,356 B1 | * | 4/2002 | Thornton et al. ........... 257/189 |

* cited by examiner

Primary Examiner—Patrick Ryan
Assistant Examiner—Thomas H. Parsons
(74) Attorney, Agent, or Firm—Daniel L. Dawes; Myers Dawes Andras & Sherman LLP

(57) ABSTRACT

By using electron beam lithography, chemically assisted ion beam etching, and electroplating, high aspect ratio magnetic columns, 60 nm–170 nm in diameter, which are embedded in an aluminum-gallium-oxide/gallium-arsenide $(Al_{0.9}Ga_{0.1})_2O_3$/GaAs heterostructured substrate, are fabricated. Storage of data in electroplated Ni columns is realized in the form of tracks 0.5 $\mu$m and 0.25 $\mu$m in the down-track direction, and 1 $\mu$m in the cross-track direction, corresponding to areal densities of 1.3 and 2.6 Gbits/in$^2$ respectively. The fabrication of patterned media samples, using dry etching and oxidation of AlGaAs, and electrodeposition of Ni into GaAs substrate is realized.

32 Claims, 4 Drawing Sheets

METHOD OF ELECTROPLATING OF HIGH ASPECT RATIO METAL STRUCTURES INTO SEMICONDUCTORS

CROSS-REFERENCES TO RELATED APPLICATIONS

This application claims the benefit of U.S. Provisional Application No. 60/162,489, filed on Oct. 29, 1999.

STATEMENT REGARDING FEDERALLY SPONSORED RESEARCH OF DEVELOPMENT

The present application was funded at least in part by the U.S. Government from funds from ARO #PO 0160G9E788 and NSF Grant No. ECS-9632937 and may be subject to government rights.

BACKGROUND OF THE INVENTION

1. Field of the Invention

The method of the invention is directed to electroplating metals into high aspect ratio etched holes defined into semiconductor substrates.

2. Description of the Related Art

Lithographic patterning of arrays of nano-scale magnets allows a significant increase in the density of magnetic recording media. Such nanomagnets can be fabricated by a combination of lithography, etching, and electroplating of magnetic materials. Generally, it is undesirable for electroplating to proceed conformally with the etched semiconductor surface, since the top of the etched holes can be closed up before the bottom of the holes are completely filled.

Lithographic patterning of arrays of individual nano-scale magnets holds the prospect of advancing magnetic storage to areal densities exceeding the predicted limit of conventionally sputtered, multialloyed thin film recording media. Instead of having hundreds of magnetic grains per bit, patterned media utilizes only one larger-sized magnetic particle for every bit of stored information. Due to the larger volume of each bit, the onset of the superparamagnetic effect, a state at which the individual bit is no longer stable against thermally activated magnetization reversal, should in principle be delayed.

Assuming that each bit is small enough to be a single domain, and large enough to be thermally stable, a square array of nano-magnets with periodicity of 80 nm or smaller would correspond to storage densities of 100 Gbits/in$^2$ and higher. Previous studies, however, have shown that the coercivity of the resulting columns was not high enough to achieve the magnetic stability required for reliable reading and writing of this form of media.

BRIEF SUMMARY OF THE INVENTION

The method of the invention plates metals into etched holes from the bottom of the hole upwards, thereby defining dense plated material. One method is comprised of the introduction of a doped p-n junction in the semiconductor, which is reverse-biased during the plating process. Another embodiment relies on a highly doped layer underneath the surface of the substrate, which can be used as the "seeding layer" for the plating process. Finally, plating can proceed after the selective conversion of semiconductor layers into oxide insulator materials through an oxidation process and defining "current apertures".

In this method, a p-n junction is either grown or defined through implantation or diffusion, to define a surface layer which can become insulating during the electroplating process. After this procedure, lithography and ion etching are used to define holes through the p-n junction. When this layer is designed properly, it becomes depleted during the application of the electroplating voltage, and this allows current to flow only through the fabricated holes. This will force the electroplating to be limited only to the areas in which the p-n junction is perforated, and will avoid plating onto the sidewalls of the holes.

A surface layer on a conducting semiconductor substrate can be rendered insulating by either diffusion or implantation of dopants which can act as traps, significantly reducing the number of carriers in the material at the surface. Similarly, ion damage can be used to introduce such traps, and result in an insulating surface layer. This layer can again be perforated locally by the fabrication of holes, resulting in current flow only in the holes during the electroplating process.

Selective oxidation can be used to convert one semiconducting material into its oxide form without changing the composition of another. A typical example is given in the AlAs/GaAs heterostructure system. AlAs is oxidized much more rapidly in the presence of steam than GaAs, resulting in the selective oxidation of this layer. Careful control over the geometries and oxidation rates has resulted in the definition of "oxide apertures" to define the current flow in the vertical direction perpendicular to the converted AlAs layers. We propose to use this selective oxidation step after the definition of microfabricated holes to limit the deposition of metal onto the bottom of the holes.

More particularly, the invention is defined as a method comprising the steps of defining at least one hole having a greater depth than width into a substrate, converting the at least one hole in the substrate into a current aperture, and plating a conductive material through the current aperture into the at least one hole from a bottom thereof upwards.

In one embodiment the hole is converted into a current aperture by forming a doped p-n junction in the substrate. In another embodiment the hole is converted into a current aperture by converting at least a surface layer on the substrate into an insulating layer by creation of carrier traps therein. The method of creating of carrier traps comprises forming a doped layer underneath the surface layer of the substrate, which doped layer is used as the seeding layer for plating. Alternatively, the carrier traps are created by creating ion damage beneath the surface layer.

In another embodiment the hole is converted into a current aperture by disposing at least one semiconductor layer on the substrate and selectively converting the at least one semiconductor layer into an oxide insulator.

In still another embodiment the hole is converted into a current aperture by disposing a semiconductor layer of a first conductivity type, such as an n-type, on the substrate which is of a second conductivity type, such as a p-type. The hole is then defined into the substrate and through the semiconductor layer of a first conductivity type to form a junction therebetween. The conductive material is plated through the current aperture into the hole from the bottom thereof upwards by reverse biasing the junction during plating.

In one embodiment an AlAs/GaAs heterostructured layer is disposed on a GaAs substrate, and selectively converted into a Al$_2$O$_3$/GaAs heterostructured layer. The AlAs/GaAs heterostructured layer is converted into a Al$_2$O$_3$/GaAs heterostructured layer after defining the hole into the substrate.

More generally, the hole is converted into a current aperture by first disposing a Al$_x$Ga$_{1-x}$As and a GaAs cap layer on a conductive GaAs substrate, or more specifically disposing a $Al_{0.9}Ga_{0.1}As$ layer. In the illustrated embodiment a graded layer of AlGaAs is disposed on both sides of the $Al_xGa_{1-x}As$ layer to promote adhesion. The method further comprises disposing a polymethylmethacrylate (PMMA) mask layer on the GaAs cap layer to serve as both an e-beam sensitive resist and an ion etch mask.

In a data storage application of the method, a dot array pattern is defined on and through the PMMA mask layer by vector-scanned electron beam lithography, developed and selectively transferred into both the GaAs cap layer and the underlying $Al_xGa_{1-x}As$ layer by $Cl_2$ assisted ion beam etching. The dot array pattern is transferred into both the GaAs cap layer and the underlying $Al_xGa_{1-x}As$ layer by using an assisted ion beam etching (CAIBE) system with a Kauffman Ar+ion source in conjunction with a gas introduction nozzle to accelerate high energy ions towards the GaAs substrate covered with the PMMA mask layer to achieve a high etching rate and selectivity of the semiconductor substrate, as well as the directionality for defining high aspect ratio structures. The assisted ion beam etching is performed immediately before converting the hole into a current aperture to enable a more reproducible oxidation process.

The conductive material is plated through the current aperture into the hole by plating Ni, which is used as an anode in an electroplating apparatus in which a conductive GaAs substrate is used as a cathode, etching the Ni anode in HCl immediately before each plating session to minimize any contaminants to be deposited into the hole, using nickel sulfamate as a plating medium, and applying a pulsed electroplating current.

The invention also includes within its scope the structures and apparatus made by the foregoing method. Although the method has been described above in some cases as a combination of steps for grammatical purposes, it is to be expressly understood that the scope of the method disclosed and claimed is not to be limited or construed by 35 USC 112 steps. The invention can be better visualized by turning now to the following drawings wherein like elements are referenced by like numerals.

Figure 1A:
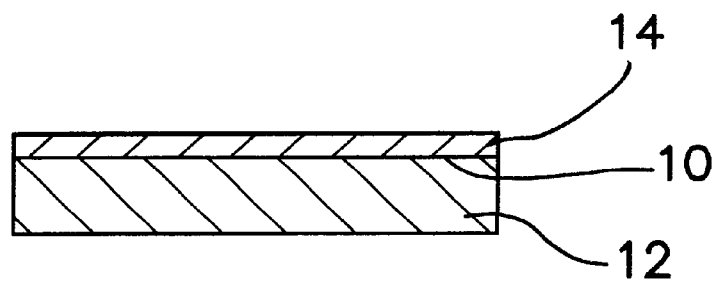
FIGS. 1a–1c are diagrammatic cross-sectional views of a substrate on which the magnetic columns are fabricated according to the invention.

The invention and its various embodiments may now be better understood by turning to the following detailed description of the preferred embodiments.

DETAILED DESCRIPTION OF THE INVENTION

In the illustrated embodiment what is shown are freestanding magnets of 20 nm diameter and 100 nm spacing (representing a particle density of 65 Gbits/in$^2$ using electron beam lithography. A more realistic structure would be to make embedded Ni columns in a durable $SiO_2$ substrate using conventional magneto-resistive (MR) sensors to detect the fields coming out of a patterned media sample. Such structures are well known and are described in Kraus et.al., J.Vac.Sci. Technol. B, 13, 2850 (1995).

In order to improve the coercivity of the individual magnetic columns without switching to a different magnetic material system such as cobalt, the invention provides a fabrication process for creating high aspect ratio Ni magnets that are embedded in an $Al_2O_3$/GaAs substrate. In this embodiment advantage is taken of the shape anisotropy of the Ni columns to achieve the stability required for the media to be useful for information storage. The etch rate selectivity of $Al_2O_3$ over GaAs can exceed 30:1. Thus, changing to a AlAs/GaAs material system should promote the fabrication of high aspect magnetic columns. The individual magnetic columns, isolated from one another by the non-magnetic semiconductor substrate, are oriented perpendicular to the surface. Thus, each column represents a "0" or "1" when its magnetization is oriented either parallel or antiparallel to the long axis of the particle. The columns in the illustrated embodiment are 60–230 nm in diameter, and have a 6:1 aspect ratio. The magnets are arranged in a square array with a 2 μm column-to-column spacing. This configuration was used for the initial recording demonstrations using current read/write technology. Magnets made in the $Al_2O$/GaAs matrix are stable against switching when read by a magneto-resistive (MR) element. Data storage is achieved in these individual single domain magnetic nanocolumns (170 nm diameter) using current magnetic recording technology.

Patterned media with columns that are spaced closer together can be fabricated using the invention, and still provide reliable reading and writing of individual columns using conventional read/write technology. Since the read element (magneto-resistive or spin-valve) is much wider in the cross-track direction than it is in the down-track direction, our current work focuses on the fabrication and characterization of patterned media in the form of tracks. These structures have the columns separated in the x-direction by 1 μm due to the width of the recently obtained spin-valve sensors. The columns are spaced in the y-direction by 0.5 μm, 0.25 μm, and 0.125 μm in order to allow a systematic study of the recording properties of patterned media samples with increasing down-track densities. These correspond to areal densities of 1.3, 2.6, and 5.2 Gbits/in$^2$ respectively. It must be expressly understood that the spacing listed above is limited by the widths of the sensors used in the illustrated embodiment, and not by our lithographic method, which is capable of defining structures far beyond 50 Gbits/in$^2$.

Figure 1B:
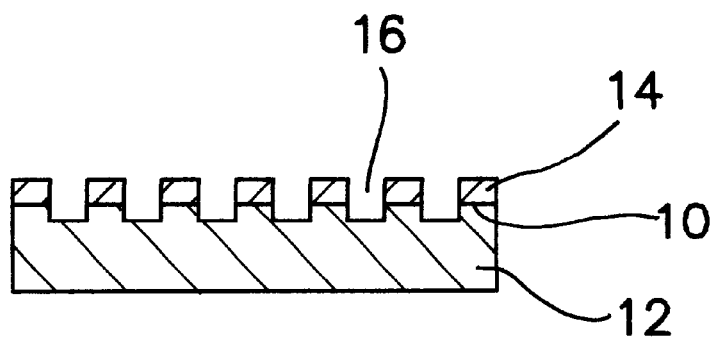
Figure 1C:
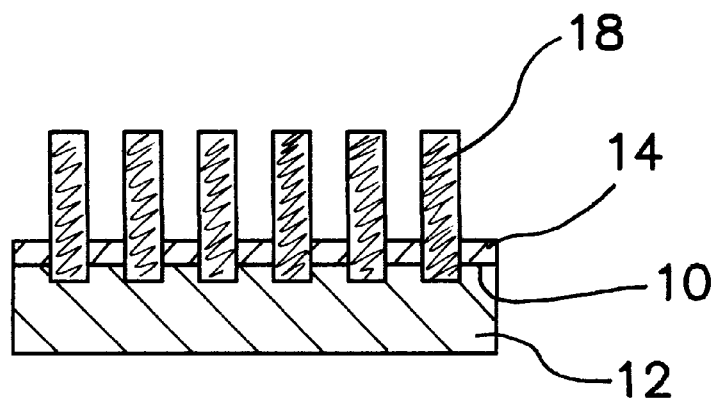

Consider first the methodology in general terms in FIGS. 1a–c and 2a–2c and then turn to a specifically illustrated embodiment in FIGS. 3a–3f. Turning then first to FIGS. 1a–1c which are diagrammatic cross-sectional side views of the process of the invention. FIG. 1a shows the beginning of the process in which a pn junction 10 is formed between a p-type substrate 12 and an overlying n-type semiconductor 14. N-type semiconductor 14 will define a surface layer which will become insulating during the electroplating process. A plurality of holes 16 are defined lithographically and ion etched through the p-n junction 10 as shown in FIG. 1b. With the application of an electroplating voltage layer 14 becomes depleted, and this allows current to flow only through the fabricated holes 16. This forces the electroplating to be limited only to the areas in which the p-n junction 10 is perforated, and will avoid plating onto the sidewalls of holes 16 resulting in metal columns 18 disposed in holes 16 and extending therefrom by electroplating as shown in FIG. 1c.

A surface layer 14 on a conducting semiconductor substrate 12 can also be rendered insulating by either diffusion or implantation of dopants which can act as traps, to significantly reduce the number of carriers in the material at the surface. Similarly, ion damage can be used to introduce such traps, and result in an insulating surface layer 14. This layer can again be perforated locally by the fabrication of holes 16, resulting in current flow only in the holes 16 during the electroplating process.

Figure 2A:
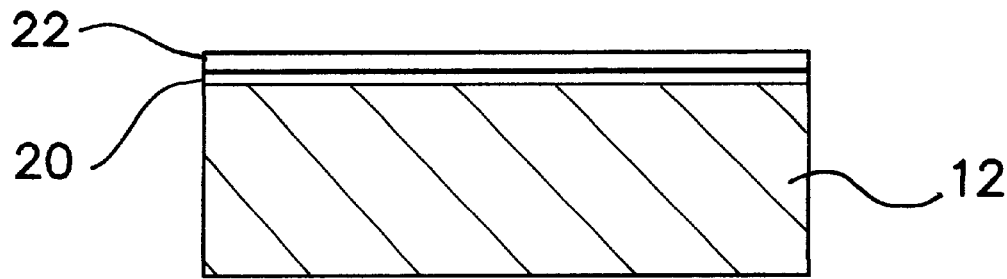
FIGS. 2a–2c are diagrammatic cross-sectional views of a substrate on which the magnetic columns are fabricated according to another embodiment of the invention.
Figure 2B:
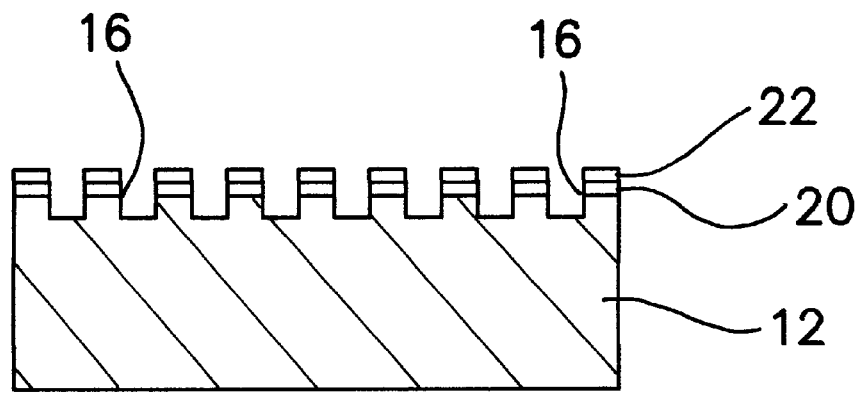
Figure 2C:
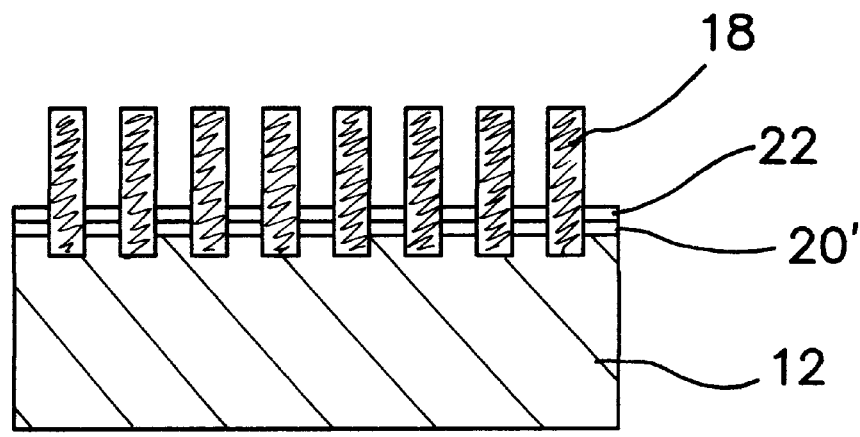

FIGS. 2a–2c illustrate the embodiment in which selective oxidation is used to convert a semiconducting layer into its oxide form without changing the composition of another semiconducting layer. FIG. 2a is a diagrammatic cross-sectional view of a GaAs substrate 12 on which a GaAs layer 22 and AlAs layer 20 have been epitaxially grown. Holes 16 are again lithographically patterned and defined through epitaxial layers 22 and 20 into substrate 12 by ion etching as shown in FIG. 2b. AlAs layer 20 is then oxidized with a steam or wet oxidation step converting it into an $Al_2O_3$ layer 20' and leaving GaAs layer 22 relatively nonoxidized. Thereafter, metal columns 18 are disposed in holes 16 and extended therefrom by electroplating as shown in FIG. 2c.

Figure 3A:
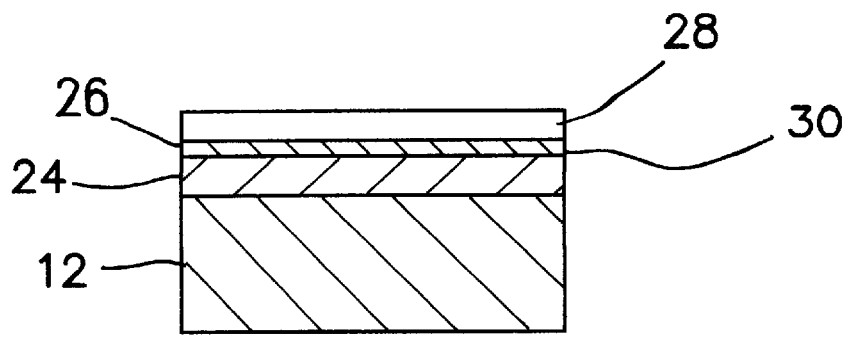
FIGS. 3a–3f are diagrammatic cross-sectional views of a substrate on which the magnetic columns are fabricated according to still another embodiment of the invention.
Figure 3B:
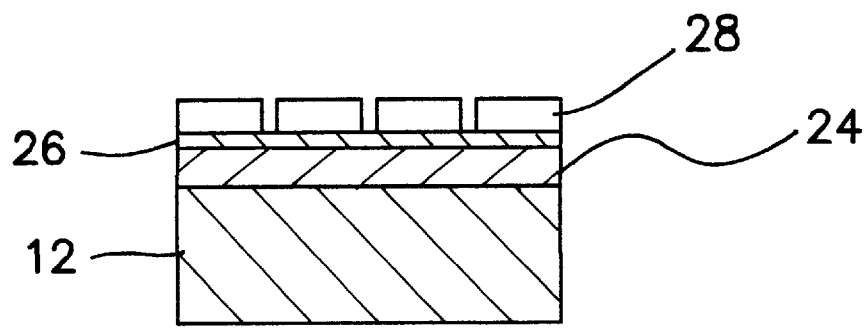
Figure 3C:
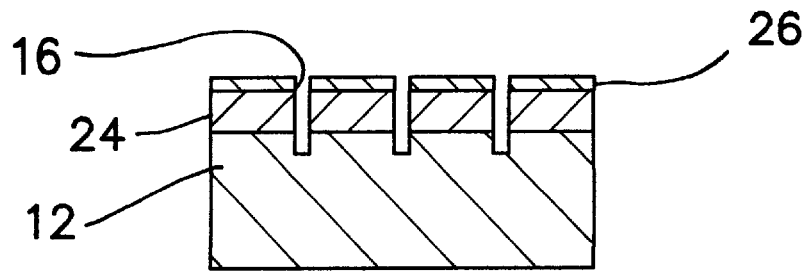

The methodology of the preferred embodiment is shown schematically in FIGS. 3a–3f. A 250 nm layer 24 of $Al_{0.9}Ga_{0.1}As$ and a 100 nm GaAs cap layer 26 are grown by metal-organic chemical vapor deposition (MOCVD) on top of a conductive GaAs substrate 12. A 15 nm graded layer 30 of AlGaAs is added to both sides of the $Al_{0.9}Ga_{0.1}As$ layer 24 to promote adhesion during the post-etching oxidation process. Instead of using Cr/Au and $SiO_2$ as etch masks, we now employ only a thicker layer 28 (550 nm) of high molecular weight (950,000) polymethylmethacrylate (PMMA), which serves as both an e-beam sensitive resist and an ion etch mask as shown in FIG. 3a. This is a simpler fabrication procedure that still allows us to achieve the required high aspect ratio columns. The dot array patterns are defined on and through PMMA layer 28, which is baked at 150° C. for 1½ hours, by vector-scanned electron beam lithography, followed by development in a 3:7 cellulose-methanol mixture to result in the structure of FIG. 3b. The patterns are then selectively transferred into both GaAs cap 24 and the underlying $Al_{0.9}Ga_{0.1}As$ layer by $Cl_2$ assisted ion beam etching as depicted in FIG. 3c. In our chemically assisted ion beam etching (CAIBE) system, a Kauffman Ar+ion source is used in conjunction with a gas introduction nozzle to accelerate high energy ions towards substrate 12 covered with an etch mask. This allows us to achieve a high etching rate and selectivity of the semiconductor substrate, as well as the directionality necessary for defining high aspect ratio structures.

Figure 3D:
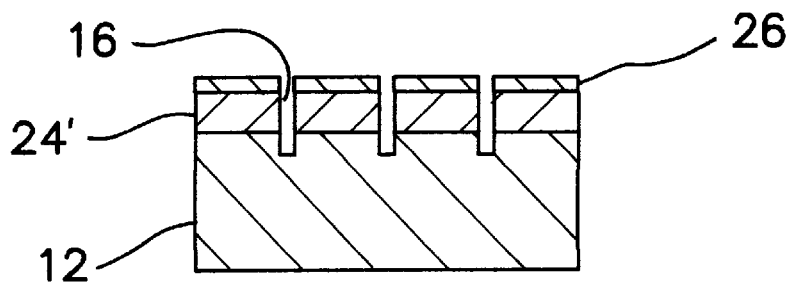
Figure 3E:
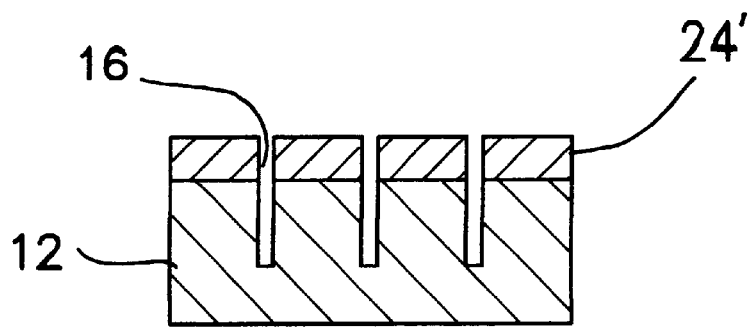

Following CAIBE, the sample is rinsed in acetone and dichloromethane to remove the remaining PMMA. To ensure complete removal of the PMMA after etching, cross-linking of PMMA is avoided by using a lower beam current (20 mA) and keeping the sample stage cooled during CAIBE. The $Al_{0.9}Ga_{0.1}As$ layer is subsequently converted into a $(Al_{0.9}Ga_{0.1})_2O_3$ layer 24' by wet thermal oxidation in a 1 inch diameter tube furnace at 380° C. for 1½ hours as depicted in FIG. 3d. Water vapor is supplied to the tube by bubbling nitrogen gas at 0.5 L/min through deionized water heated at 85° C. To enable a more reproducible oxidation process, each sample is etched right before the oxidation, and nitrogen gas and water vapor is allowed into the furnace ½ hour prior to each run. The resulting robust layer of $(Al_{0.9}Ga_{0.1})_2O_3$ is the final mask for pattern amplification in the perpendicular direction into the GaAs substrate by using further CAIBE as shown in FIG. 3e.

Figure 3F:
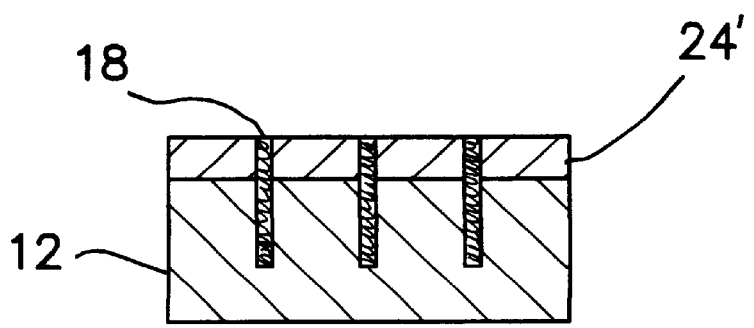

Once the hole array patterns are transferred to the desired depth into the GaAs substrate 12 after additional CAIBE, electroplating is then used to deposit Ni into holes 16 as shown in FIG. 3f. The plating apparatus is conventional, where the electroplating probe contacts the sample outside of the plating bath and does not disturb the electrodeposition of the Ni columns 18. In our case, Ni is used as the anode and the conductive GaAs substrate 12 is used as the cathode. The Ni anode or column 18 is etched in HCl immediately before each plating session so as to minimize any contaminants to be deposited into the hole arrays. Nickel sulfamate is used as the plating medium and a pulse current with a duty cycle of 80% (2 sec on and 0.5 sec off) is applied. The plating is conducted under an optical microscope, and end point detection is possible through the change in optical contrast of the plated Ni columns 18. Precise end point detection is not critical in our case as any overplated Ni column 18 can be polished to the desired height, which is determined by the thickness of the $(Al_{0.9}Ga_{0.1})_2O_3$ layer, using a chemical mechanical polish (CMP). For polishing, we use a CMP pad SIP2000A manufactured by Rodel Inc. in combination with a polishing slurry which is comprised of a liquid dispersion of 20–30 nm colloidal silica spheres at a concentration of 28%, and with a pH of 11.3.

Figure 4:
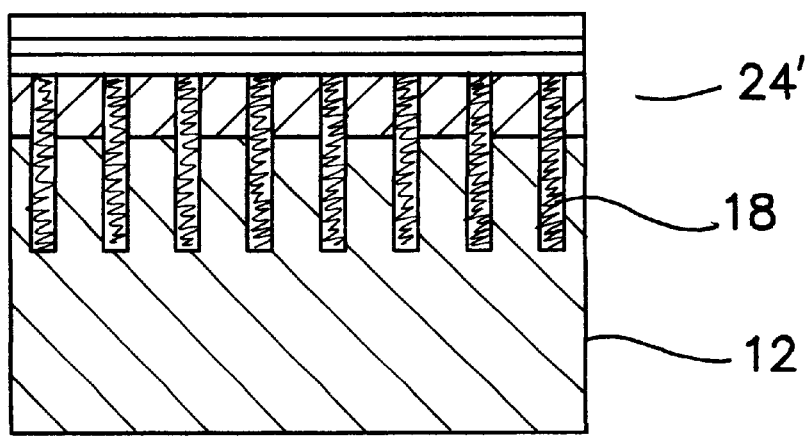
FIG. 4 is a graphic depiction of a scanning electron microscopic image of a cleaved grating illustrating magnetic Ni columns after oxidation.

Consider first in more detail the two dimensional masking of the preferred embodiment. Using this procedure, arrays of Ni columns 18 have been fabricated that are embedded in a robust $(Al_{0.9}Ga_{0.1})_2O_3$/GaAs substrate. In the illustrated embodiment arrays of etched holes 16 have been made in the GaAs cap 26/$(Al_{0.9}Ga_{0.1})_2O_3$ layer 24'—GaAs substrate 12 heterostructure after oxidation and additional CAIBE, which holes 16 are 120 nm in diameter, as shown in FIG. 3f. In order to evaluate the etch depth and profile of the fabricated samples, line gratings have been fabricated in addition to hole arrays. The line gratings are etched using the same procedures, and are cleaved prior to electroplating. FIG. 4 shows a cross-section view of eight lines that have been cleaved after three CAIBE etching procedures (2 mins each run), with the top darker layer being the remaining, namely the $Al_{0.9}Ga_{0.1})_2O_3$ mask. The average width of the lines increase from 190 nm on the right to 410 nm on the left in the image, and have etch depths that range from 1.8 $\mu$m on the right to 2 $\mu$m on the left of FIG. 4. These correspond to aspect ratios of approximately 9:1 to 5:1 respectively. The sidewall profile and etch depth of the trenches in FIG. 4 suggest the high anisotropy of the chemically assisted ion beam etching process, as well as the robustness of the $(Al_{0.9}Ga_{0.1})_2O_3$ layer as an ion etch mask for the GaAs substrate.

Turn now and consider the steam oxidation used in the preferred embodiment. During the oxidation procedure, the $Al_{0.9}Ga_{0.1}As$ layer 24' underneath GaAs cap 26 is oxidized laterally through the hole array patterns. The oxidation rate is highly dependent on the Al content in the AlGaAs layer 24 as well as the furnace temperature. Thus, calibration for the specific composition and thickness of AlGaAs layer 24, as well as the furnace environment is necessary. In the illustrated embodiment an array of etched holes 16 of 225 nm diameter were formed, which are 0.5 $\mu$m apart in the y-direction and 1 $\mu$m apart in the x-direction. Holes 16 are oxidized partially in the lateral direction. The oxide extent is 250 nm after 30 mins in the furnace environment described here. The oxidation process seems to be isotropic in the $Al_{0.9}Ga_{0.1}As$ layer 24. The unoxidized portion of the AlGaAs layer 24 is removed by further CAIBE The sidewalls of the etched holes 16 can be observed through the $(Al_{0.9}Ga_{0.1})_2O_3$ layer 24, and they reveal the high anisotropy of the ion etching process. Although the structures obtained are sufficient for electroplating Ni columns 18, it is preferable to have a very smooth and robust surface, including the areas between the columns 18, for proper slider contact in subsequent magnetic characterization. Therefore, longer oxidation times are necessary before additional CAIBE and electroplating.

A sample of two track arrays of holes 16 and columns 18 has been made which has been completely oxidized between the columns 18 even in the cross-track direction (11.1 m spacing). The $(Al_{0.9}Ga_{0.1})_2O_3$ layer 24' extent is 1.67 µm after 2 hours of oxidation. Once again, the unoxidized AlGaAs layer 26 is etched away by CAIBE after oxidation, and the $(Al_{0.9}Ga_{0.1})_2O_3$ mask or layer 24' remains intact.

Consider now the step of electroplating into the semiconductor materials. The electroplating of magnetic materials into semiconductor is still not a well-characterized process, and the quality of the electroplated magnetic structures was initially a concern. According to the invention however, that the Ni columns 18 plated in etched holes 16 in conductive GaAs substrate 12 have similar magnetic properties to the Ni columns 18 plated from a metallic seeding layer, such as gold. We therefore continue to use electroplating to form the Ni columns used in our patterned media work.

A 50×50 electroplated Ni column array 18 of 200 nm diameter, with a 0.5 µm spacing down-track and a 1 µm spacing cross-track has been fabricated, embedded in an $(Al_{0.9}Ga_{0.1})_2O_3$/GaAs substrate heterostructure as describe above. Pulse plating is preferred over dc plating since the former is believed to have more "throwing" power, which should facilitate the filling of Ni into the high aspect ratio holes 16 in substrate 12. It was observed that each hole 16 is evenly filled, and the plating seemed to be very uniform over a large area. The adhesion of the $(Al_{0.9}Ga_{0.1})_2O_3$ layer to the semiconductor substrate 12 is critical during the electroplating process. If the adhesion is poor, we find that the plating may propagate laterally between the $(Al_{0.9}Ga_{0.1})_2O_3$/GaAs layers 24', 12, and Ni disks 18 will be formed along the interface. This situation is undesirable, and has prompted us to use $Al_{0.9}Ga_{0.1}As$ instead of AlAs for the oxide masking layer 24'. It has been found that the oxide formed from AlGaAs alloy tends to be more mechanically stable against delamination along the oxide/semiconductor interfaces after any post-oxidation thermal cycling or processing steps which require temperatures of >100° C. With the addition of the thin graded layer of AlGaAs between the GaAs layer 26 and AlGaAs layer 24, the adhesion of the mask 24 prior to the final etch has also been further enhanced. Another advantage of using AlGaAs alloys is that the linear shrinkage of oxidized AlGaAs layers 26 (formed above 300° C.) is less than that from AlAs layers. The reduced shrinkage is preferable in order to preserve the small diameters of the defined holes 16.

Consider now the magnetic properties of an array devised according to the invention. Magnetic force microscopy (MFM) is initially used to characterize the magnetic properties of the patterned media fabricated according to the preferred embodiment. In the MFM measurement, we use a home-made MFM utilizing electrochemically etched nickel tips and a fiber-optic interferometer as the vibration detector. An array of Ni columns 18 embedded in an $(Al_{0.9}Ga_{0.1})_2O_3$/GaAs substrate heterostructure was fabricated according to the invention. Columns 18 were 200 nm in diameter, and were spaced 0.5 µm and 1 µm in the down-track and cross-track direction respectively. What is seen as black and white contrast seen in the MFM image of the array represents the two possible magnetization states, which are parallel or anti-parallel to the long axis of the cylindrical columns 18.

Once the electroplated Ni columns 18 are confirmed to be magnetic using MFM, we demonstrate the data storage capabilities of our structures using conventional scanning magneto-resistance microscopy (SMRM). In the SMRM technique, a slider, comprised of commercial inductive write poles and a magneto-resistive or spin valve read sensor, such as used in conventional magnetic recording is placed in contact with the sample. The smoothness of the $(Al_{0.9}Ga_{0.1})_2O_3$ surface 24' and the embedded structure of the Ni columns 18 allow minimum distance between the read sensor and the medium. This is critical for maximizing the resolution and magnitude of the signal from individual magnetic columns 18. Our previous results have shown that the spatial extent of the column response in the down-track direction is on the order of 500 nm, which should still allow us to resolve each individual column 18 when the down-track separations are 500 nm. Further reduction in the distance between the columns 18 (250 nm and 125 nm) will enable us to study the interesting regime of patterned media storage, where the signals from adjacent columns are interfering with the signal from the column directly below the read sensor.

In addition to the magnetic characterization of the structures fabricated according to the invention, consider the fabrication of even higher density arrays. Using electron beam lithography, we have patterned large arrays of holes 16 of 18 nm diameter and 100 nm spacing giving a 65 Gbits/in$^2$ into a 450 nm-thick PMMA layer 28, which again serves as both the e-beam resist and an ion etch mask. We have used $Cl_2$ assisted ion beam etching to transfer the hole patterns into $Al_{0.9}Ga_{0.1}As$ layer 24, which is converted into a robust $(Al_{0.9}Ga_{0.1})_2O_3$ mask 24' during wet thermal oxidation to form a 100×100 array of etched holes 16 of 18 nm diameter and 100 nm spacing in an $Al_{0.9}Ga_{0.1}As$/GaAs substrate heterostructure. One difficulty with the smaller diameter holes 16 is the slower etching rate compared with the bigger diameter holes 16. If the first CAIBE stops in the $Al_{0.9}Ga_{0.1}As$ layer 24 instead of the GaAs substrate 12, the bottom of the hole patterns will be converted to $(Al_{0.9}Ga_{0.1})_2O_3$ after oxidation. When this happens, any further transfer of the hole patterns into the GaAs substrate 12 will be very difficult, and in some cases, impossible without the complete degradation of the $(Al_{0.9}Ga_{0.1})_2O_3$ masking layer 24'. One solution will be to use thicker PMMA masking layer 28, provided that the high resolution of the e-beam lithography is preserved. $Cr/Au/SiO_2$ masking layers can also be used in conjunction with a thin layer of PMMA. A thinner AlGaAs masking layer may be sufficient as well, since smaller diameter holes 16 will require shallower etch depths for the same aspect ratio.

For data storage demonstration purposes, denser Ni columns 18 in the form of tracks have been fabricated by further reducing the spacing in the down-track direction, while keeping the 1 µm spacing in the cross-track direction. An array of etched holes 16 of 35 nm diameter, spaced 0.125 µm and 1 µm apart in the y- and x-direction respectively has been fabricated in an $(Al_{0.9}Ga_{0.1})_2O_3$/GaAs substrate heterostructure. The ability to record in the individual magnetic columns 18 in this 5.2 Gbits/in$^2$ configuration demonstrates the promise of perpendicular patterned media for high density data storage. This areal density can be greatly enhanced when narrower read sensors become available and the tracks are spaced closer than 1 µm in the cross-track direction.

Thus, what has been disclosed is a method for making perpendicular patterned media structure consisting of cylindrical high aspect ratio single domain Ni particles or columns 18, embedded in a durable nonmagnetic $(Al_{0.9}Ga_{0.1})_2O_3$/GaAs substrate heterostructure. The technique involves the use of PMMA as both an e-beam sensitive resist and an ion beam etch mask. The high aspect ratio of the Ni columns 18 is achieved through the high anisotropy of the chemically assisted ion beam etch as well as the superb selectivity of GaAs over $(Al_{0.9}Ga_{0.1})_2O_3$ during CAIBE. Electroplating is used to deposit Ni into the holes 16 in the semiconductor substrate 12. We have fabricated Ni columns 18 in the form of tracks, and have used MFM to characterize the plated Ni. The invention is characterized by using MFM and SMRM, its use for data storage in higher density patterned media structures has been demonstrated.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A method comprising:
   defining at least one hole having a greater depth than width into a substrate;
   converting said at least one hole in said substrate into a current aperture; and
   plating a conductive material through said current aperture into said at least one hole to fill the hole from a bottom thereof upwards.

2. A method comprising:
   defining at least one hole having a greater depth than width into a substrate;
   converting said at least one hole in said substrate into a current aperture; and
   plating a conductive material through said current aperture into said at least one hole to fill the hole from a bottom thereof upwards,
   where converting said at least one hole in said substrate into a current aperture comprises forming a doped active p-n junction in the hole in said substrate.

3. A method comprising:
   defining at least one hole having a greater depth than width into a substrate;
   converting said at least one hole in said substrate into a current aperture; and
   plating a conductive material through said current aperture into said at least one hole to fill the hole from a bottom thereof upwards,
   where converting said at least one hole in said substrate into a current aperture comprises converting at least a surface layer on said substrate adjacent to the hole into an insulating layer by creation of carrier traps therein with an active pn junction being perforated by the hole.

4. The method of claim 3 where converting at least a surface layer on said substrate into an insulating layer by creation of carrier traps therein comprises forming a doped layer underneath said surface layer of said substrate, which doped layer is used as the seeding layer for plating.

5. The method of claim 3 where converting at least a surface layer on said substrate into an insulating layer by creation of carrier traps therein comprises creating ion damage beneath said surface layer.

6. A method comprising:
   defining at least one hole having a greater depth than width into a substrate;
   converting said at least one hole in said substrate into a current aperture; and
   plating a conductive material through said current aperture into said at least one hole to fill the hole from a bottom thereof upwards,
   where converting said at least one hole in said substrate into a current aperture comprises disposing at least one semiconductor layer on said substrate adjacent to the hole and selectively converting said at least one semiconductor layer into an oxide insulator.

7. A method comprising:
   defining at least one hole having a greater depth than width into a substrate;
   converting said at least one hole in said substrate into a current aperture; and
   plating a conductive material through said current aperture into said at least one hole to fill the hole from a bottom thereof upwards,
   where converting said at least one hole in said substrate into a current aperture comprises disposing a semiconductor layer of a first conductivity type on said substrate, where said substrate is of a second conductivity type, and then defining at least one hole having a greater depth than width into said substrate and through said semiconductor layer of a first conductivity type to form an active junction therebetween in the hole.

8. The method of claim 7 where plating a conductive material through said current aperture into said at least one hole from a bottom thereof upwards further comprises reverse biasing said junction during plating.

9. A method comprising:
defining at least one hole having a greater depth than width into a substrate;
converting said at least one hole in said substrate into a current aperture; and
plating a conductive material through said current aperture into said at least one hole from a bottom thereof upwards,
where converting said at least one hole in said substrate into a current aperture comprises disposing at least one semiconductor layer on said substrate and selectively converting said at least one semiconductor layer into an oxide insulator, and where disposing at least one semiconductor layer on said substrate and selectively converting said at least one semiconductor layer into an oxide insulator comprises disposing AlAs/GaAs heterostructured layer on a GaAs substrate, and, selectively converting said AlAs/GaAs heterostructured layer into a $Al_2O_3$/GaAs heterostructured layer.

10. The method of claim 9 where converting said AlAs/GaAs heterostructured layer into a $Al_2O_3$/GaAs heterostructured layer is performed after defining said at least one hole into said substrate.

11. A method comprising:
defining at least one hole having a greater depth than width into a substrate;
converting said at least one hole in said substrate into a current aperture; and
plating a conductive material through said current aperture into said at least one hole from a bottom thereof upwards,
where converting said at least one hole in said substrate into a current aperture comprises disposing a $Al_xGa_{1-x}As$ and a GaAs cap layer on a conductive GaAs substrate.

12. The method of claim 11 where disposing a $Al_xGa_{1-x}As$ layer comprises disposing a $Al_{0.9}Ga_{0.1}As$ layer.

13. The method of claim 11 further comprising disposing a graded layer of AlGaAs to both sides of said $Al_xGa_{1-x}As$ layer to promote adhesion.

14. The method of claim 11 further comprising disposing a polymethylmethacrylate (PMMA) mask layer on said GaAs cap layer to serve as both an e-beam sensitive resist and an ion etch mask.

15. The method of claim 14 where defining at least one hole having a greater depth than width into a substrate comprises defining a dot array pattern on and through said PMMA mask layer by vector-scanned electron beam lithography, developing said dot array pattern in said PMMA mask layer, and selectively transferring said dot array pattern into both said GaAs cap layer and said underlying $Al_xGa_{1-x}As$ layer by $Cl_2$ assisted ion beam etching.

16. The method of claim 15 where selectively transferring said dot array pattern into both said GaAs cap layer and said underlying $Al_xGa_{1-x}As$ layer by $Cl_2$ assisted ion beam etching comprises using an assisted ion beam etching (CAIBE) system with a Kauffman Ar+ion source in conjunction with a gas introduction nozzle to accelerate high energy ions towards said GaAs substrate covered with said PMMA mask layer to achieve a high etching rate and selectivity of the semiconductor substrate, as well as the directionality for defining high aspect ratio structures.

17. The method of claim 16 where assisted ion beam etching is performed immediately before converting said at least one hole in said substrate into a current aperture by disposing at least one semiconductor layer on said substrate and selectively converting said at least one semiconductor layer into an oxide insulator to enable a more reproducible oxidation process.

18. A method comprising:
defining at least one hole having a greater depth than width into a substrate;
converting said at least one hole in said substrate into a current aperture; and
plating a conductive material through said current aperture into said at least one hole from a bottom thereof upwards,
where plating a conductive material through said current aperture into said at least one hole from a bottom thereof upwards comprises plating Ni, which is used as an anode in an electroplating apparatus in which a conductive GaAs substrate is used as a cathode, etching said Ni anode in HCl immediately before each plating session to minimize any contaminants to be deposited into said hole, using nickel sulfamate as a plating medium, and applying a pulsed electroplating current.

19. An apparatus comprising:
a substrate;
at least one hole in said substrate formed to act as a current aperture, said at least one hole having a greater depth than width to define an aspect ratio of depth to width; and
a conductive material plated through said current aperture into said at least one hole filling the hole from a bottom thereof upwards.

20. The apparatus of claim 19 where said aspect ratio is at least 6:1.

21. An apparatus comprising:
a substrate;
at least one hole in said substrate formed to act as a current aperture, said at least one hole having a greater depth than width to define an aspect ratio of depth to width; and
a conductive material plated through said current aperture into said at least one hole filling the hole from a bottom thereof upwards
where said at least one hole in said substrate formed to act as a current aperture comprises at least one hole defined through a doped p-n junction in said substrate.

22. An apparatus comprising:
a substrate;
at least one hole in said substrate formed to act as a current aperture, said at least one hole having a greater depth than width to define an aspect ratio of depth to width; and
a conductive material plated through said current aperture into said at least one hole filling the hole from a bottom thereof upwards
where said at least one hole in said substrate formed to act as current aperture comprises at least one hole in at least one surface layer disposed on said substrate adjacent to the hole which has been converted into an insulating layer by creation of carrier traps therein.

23. The apparatus of claim 22 where said at least one surface layer on said substrate comprises a doped layer underneath said surface layer of said substrate, which doped layer is used as the seeding layer for plating.

24. The apparatus of claim 22 where said at least one surface layer on said substrate comprises an ion damaged layer beneath said surface layer.

25. An apparatus comprising:

a substrate;

at least one hole in said substrate formed to act as a current aperture, said at least one hole having a greater depth than width to define an aspect ratio of depth to width; and a conductive material plated through said current aperture into said at least one hole from a bottom thereof upwards, where said at least one hole in said substrate comprises at least one semiconductor layer disposed on said substrate and converted into an oxide insulator.

26. The apparatus of claim 25 where said at least one semiconductor layer is an AlAs/GaAs heterostructured layer and said at least one semiconductor layer converted into an oxide insulator comprises said AlAs/GaAs heterostructured layer converted into a $Al_2O_3$/GaAs heterostructured layer.

27. An apparatus comprising:

a substrate;

at least one hole in said substrate formed to act as a current aperture, said at least one hole having a greater depth than width to define an aspect ratio of depth to width; and a conductive material plated through said current aperture into said at least one hole for filling the hole from a bottom thereof upwards, where said at least one hole in said substrate comprises a semiconductor layer of a first conductivity type on said substrate adjacent to the hole, where said substrate is of a second conductivity type to form an active junction therebetween in the hole, said hole being defined through said junction.

28. An apparatus comprising:

a substrate;

at least one hole in said substrate formed to act as a current aperture, said at least one hole having a greater depth than width to define an aspect ratio of depth to width; and a conductive material plated through said current aperture into said at least one hole from a bottom thereof upwards, where said at least one hole in said substrate comprises said at least one hole disposed into an $Al_xGa_{1-x}As$ and a GaAs cap layer on a conductive GaAs substrate.

29. The apparatus of claim 28 where said $Al_xGa_{1-x}As$ layer comprises a $Al_{0.9}Ga_{0.1}As$ layer.

30. The apparatus of claim 28 further comprising a graded layer of AlGaAs disposed on both sides of said $Al_xGa_{1-x}As$ layer to promote adhesion.

31. The apparatus of claim 28 further comprising a polymethylmethacrylate (PMMA) mask layer disposed on said GaAs cap layer to serve as both an e-beam sensitive resist and an ion etch mask.

32. The apparatus of claim 31 further comprising a dot array pattern defined on and through said PMMA mask layer by vector-scanned electron beam lithography, and selectively transferred into both said GaAs cap layer and said underlying $Al_xGa_{1-x}As$ layer by $Cl_2$ assisted ion beam etching.

* * * * *